United States Patent
Chen et al.

(10) Patent No.: US 9,059,181 B2
(45) Date of Patent: Jun. 16, 2015

(54) WAFER LEVELED CHIP PACKAGING STRUCTURE AND METHOD THEREOF

(71) Applicant: Invensas Corporation, San Jose, CA (US)

(72) Inventors: Shou-Lung Chen, Yangmei Township, Taoyuan County (TW); Ching-Wen Hsaio, Banciao (TW); Yu-Hua Chen, Mingj ian Shiang (TW); Jeng-Dar Ko, Pade (TW); Chih-Ming Tzeng, Fengshan (TW); Jyh-Rong Lin, Tucheng (TW); Shan-Pu Yu, Chiayi (TW)

(73) Assignee: Invensas Corporation, San Jose, CA (US)

( * ) Notice: Subject to any disclaimer, the term of this patent is extended or adjusted under 35 U.S.C. 154(b) by 0 days.

(21) Appl. No.: 14/083,377

(22) Filed: Nov. 18, 2013

(65) Prior Publication Data

US 2014/0217587 A1    Aug. 7, 2014

Related U.S. Application Data

(63) Continuation of application No. 13/533,251, filed on Jun. 26, 2012, now Pat. No. 8,587,091, which is a continuation of application No. 11/905,869, filed on Oct. 5, 2007, now Pat. No. 8,314,482, which is a continuation of application No. 11/186,840, filed on Jul. 22, 2005, now Pat. No. 7,294,920.

(30) Foreign Application Priority Data

Jul. 23, 2004   (TW) .............................. 93122038 A

(51) Int. Cl.
*H01L 23/48*  (2006.01)
*H01L 23/538* (2006.01)
(Continued)

(52) U.S. Cl.
CPC .......... *H01L 23/5384* (2013.01); *H01L 21/486* (2013.01); *H01L 21/76898* (2013.01); *H01L 23/147* (2013.01); *H01L 23/3128* (2013.01); *H01L 23/49827* (2013.01); *H01L 23/5389* (2013.01); *H01L 24/24* (2013.01); *H01L 24/82* (2013.01); *H01L 24/94* (2013.01);
(Continued)

(58) Field of Classification Search
CPC ...... H01L 23/34; H01L 23/538; H01L 25/065
USPC .......................................... 257/738, 686, 687
See application file for complete search history.

(56) References Cited

U.S. PATENT DOCUMENTS 5,870,289 A * 2/1999 Tokuda et al. ................ 361/779
6,891,273 B2 * 5/2005 Pu et al. ........................ 257/780
(Continued)

*Primary Examiner* — Caleb Henry
(74) *Attorney, Agent, or Firm* — Christopher W. Lattin

(57) ABSTRACT

A wafer-leveled chip packaging method, comprising the steps of: providing a wafer; attaching at least one first chip to the wafer; forming a first insulating layer on the wafer; forming a plurality of first conductive vias penetrating the first insulating layer, wherein parts of the first conductive vias are electrically connected with the first chip; forming a conductive pattern layer on the surface of the first insulating layer wherein the conductive pattern layer is electrically connected with the first conductive vias; forming a plurality of through holes penetrating the wafer; filling a second insulating layer in the through holes; and forming a plurality of second conductive vias in the second insulating layer, wherein the second conductive vias are electrically connected with the first conductive vias.

14 Claims, 5 Drawing Sheets

(51) Int. Cl.
   *H01L 21/48* (2006.01)
   *H01L 21/768* (2006.01)
   *H01L 23/14* (2006.01)
   *H01L 23/31* (2006.01)
   *H01L 23/498* (2006.01)
   *H01L 23/00* (2006.01)
   *H01L 25/065* (2006.01)
   *H01L 25/10* (2006.01)
   *H01L 25/00* (2006.01)
   *H01L 23/34* (2006.01)
   *H01L 29/06* (2006.01)

(52) U.S. Cl.
   CPC ......... *H01L25/0657* (2013.01); *H01L 25/105* (2013.01); *H01L 25/50* (2013.01); *H01L 29/0657* (2013.01); *H01L 2224/24226* (2013.01); *H01L 2224/73267* (2013.01); *H01L 2224/82039* (2013.01); *H01L 2225/06524* (2013.01); *H01L 2225/06541* (2013.01); *H01L 2225/06586* (2013.01); *H01L 2924/01078* (2013.01); *H01L 2924/09701* (2013.01); *H01L 2924/14* (2013.01); *H01L 2924/15311* (2013.01); *H01L 2924/15331* (2013.01); *H01L 2924/01005* (2013.01); *H01L 2924/01006* (2013.01); *H01L 2924/01033* (2013.01); *H01L 2924/01072* (2013.01); *H01L 2924/014* (2013.01); *H01L 2225/1023* (2013.01); *H01L 2225/1058* (2013.01); *H01L 2224/32145* (2013.01); *H01L 24/97* (2013.01); *H01L 2224/94* (2013.01); *H01L 2224/97* (2013.01); *H01L 23/34* (2013.01); *H01L 2224/24146* (2013.01); *H01L 2924/07802* (2013.01)

(56) References Cited

U.S. PATENT DOCUMENTS

| | | | | |
|---|---|---|---|---|
| 6,958,544 | B2* | 10/2005 | Sunohara | 257/758 |
| 7,084,513 | B2* | 8/2006 | Matsuki et al. | 257/777 |
| 2005/0001329 | A1* | 1/2005 | Matsuki et al. | 257/777 |
| 2009/0212407 | A1* | 8/2009 | Foster et al. | 257/686 |

* cited by examiner

WAFER LEVELED CHIP PACKAGING STRUCTURE AND METHOD THEREOF

CROSS-REFERENCE TO RELATED APPLICATIONS

This application is a continuation of co-pending U.S. application Ser. No. 13/533,251, filed on Jun. 26, 2012, which is a continuation of U.S. application Ser. No. 11/905,869, filed on Oct. 5, 2007, now U.S. Pat. No. 8,314,482, which is a continuation of U.S. application Ser. No. 11/186,840, filed Jul. 22, 2005, now U.S. Pat. No. 7,294,920.

BACKGROUND OF THE INVENTION

1. Field of the Invention

The present invention relates to a wafer-leveled chip packaging structure and method thereof, and more particularly, to a wafer-leveled chip packaging structure and method thereof for forming a wafer-leveled chip package by a wafer-leveled fabrication process.

2. Description of the Related Art

A semiconductor package chip is generally encapsulated into a plastic or ceramic material, which refers to level one packaging. As a rule, the package is required to support and protect the chip, increase the heat dissipation efficiency, and provide a system for distributing the electrical power and signals input and/or output the chip. Sometimes, the package is also used for testing the performance of the chip.

An important indication to verify the advancement of the chip packaging techniques is to the ratio of the package area to the chip area. The closer the ratio to 1, the better the technique is. Several well-known chip-packaging techniques are as follows. (1) Dual-in-line packages (DIP) are initially adopted for packaging memory chips. However, the size of the DIP is much larger than the chip and occupies a significant portion of the mounting areas. Thus, the DIP is insufficient. (2) Thin-small-outline packages (TSOP) provide leads around the package chip. The TSOP is suitable for mounting lines on the surface of a PCB by surface mount technique (SMT). Thus, TSOP is reliable, suitable for high frequency application and easy to operate with. (3) Ball grid array (BGA) packages have been widely used in a large-scale integrated circuit package application such as the memory of the notebook computers. Although the power consumption increases as a result of the BGA package technique, the chips packaged therein have improved electrical and thermal performances, thus improving the reliability thereof. Also, though the number of 1/0 leads increases, the space between leads of the BGA package remains unchanged so as to be capable of increasing the product yield. Furthermore, the thickness and weight of the memory packaged are reduced. Besides, the signal transmission delays of the chips become less significant and thus the applicable frequency domain of the BGA package is broadened. (4) Chip scale packages (CSP) can reduce the ratio of the package area to the chip area to be less than 1.5. Comparing to the BGA package, the volume of a CSP memory product is smaller than that of a BGA package memory product. Besides, the CSP can have higher capacity but better heat dissipation than the BGA package. In addition, due to its significantly increased electrical performance, reliability and high system stability, the CSP has become the popular memory package technique for packaging a variety of products, such as DRAM.

Specifically speaking, the chip scale package (CSP) generally comprises a chip attaching to the surface of a substrate, wherein the substrate includes plural external contacts for electrically connecting the external device with the chip packaged therein. The substrate for the CSP comprises a flexible material such as a polymer tape, a rigid material such as silicon, ceramics or glass. The external contacts may include solder balls arranged in a dense manner such as the ball grid array (BGA) or a fine ball grid array (FBGA). Such high-density arrays can provide the chip scale package with a high input/output capability. For example, the FBGA of the CSP can have hundreds of solder balls in a unit area.

In addition, the form of central leads of memory chip packaged with the CSP can effectively shorten the signal transmitting paths. Thus, the CSP can lower the degree of the signal attenuation and increase the anti-interference and anti-noise performances of the chip packaged therein. As a result, the access time of the CSP is faster than the BGA by about 15% to 20%.

In the CSP, the memory chip is soldered to the PCB with plural solder balls which have large contact areas with the PCB, the heat generated by the memory chip during the operation can be easily transferred to the PCB for heat dissipation. On the other hand, the memory chip of the TSOP is soldered to the PCB with the leads of the chip. Therefore, the contact area between the solder and the PCB is much smaller and it is difficult to transfer heat from the chip to the PCB. Besides, the CSP can dissipate heat by its back face efficiently and be constructed compactly, whereby much unnecessary electric power consumption can be eliminated. Correspondingly, the chip packaged with the CSP can have low power consumption and lowered working temperature in comparison with the chips packaged with other package technology.

In the industry, especially in the wireless communication industry, the recent development of the chip scale packages is focused not only on reducing power consumption and packaging volume, but also on increasing the packaging density of the memory chip and performance. Therefore, stackability of the chip scale package is one of the solutions for increasing the packaging density of the memory chip and providing the chip package structure and method thereof with stackable chip scale packages are the objects of the present invention.

BRIEF SUMMARY OF THE INVENTION

An object of the present invention is to provide a wafer-leveled chip packaging method having stackable function and being processed thoroughly at the wafer level so as to reduce the fabrication cost and increase the mass production yield.

Another object of the present invention to provide a wafer-leveled chip packaging method in which the packaging process for a chip continues after another chip is carried on a wafer so as to integrate the functions of all the chips packaged. Also, the resulting wafer-leveled chip package of the present invention has stackable function so as to increase the chip density of a unit area.

A further object of the present invention is to provide a wafer-leveled chip package structure of a wafer-leveled chip package having stackable function so as to increase the chip density of a unit area. The chip package structure can be fabricated thoroughly at the wafer level so as to reduce the fabrication cost and increase the mass production yield.

To attain the aforesaid objects, a wafer-leveled chip packaging method according to the present invention comprises the steps of: (A) providing a wafer having an integrated circuit, wherein the wafer has a first surface on which a plurality of pads is mounted; (B) forming a first insulating layer on the first surface of the wafer; (C) forming a plurality of first conductive vias penetrating the first insulating layer, wherein parts of the first conductive vias are connected with the pads;

(D) forming a first conductive pattern layer on the surface of the first insulating layer, wherein the first conductive pattern layer is electrically connected with the first conductive vias; (E) forming a plurality of through holes penetrating the wafer so that parts of the first conductive vias contacting with the wafer are exposed; (F) filling a second insulating layer in the through holes; and (G) forming a plurality of second conductive vias in the second insulating layer within the through holes, and the second conductive vias are electrically connected with the first conductive vias.

To attain the aforesaid objects, a wafer-leveled chip packaging method according to the present invention comprises the steps of: (A) providing a wafer having a first surface; (B) attaching at least one first chip having a plurality of pads to the first surface of the wafer; (C) forming a first insulating layer on the first surface of the wafer; (D) forming a plurality of first conductive vias penetrating the first insulating layer, wherein parts of the first conductive vias are electrically connected with the pads of the first chip; (E) forming a first conductive pattern layer on the surface of the first insulating layer, wherein the first conductive pattern layer is electrically connected with the first conductive vias; (F) forming a plurality of through holes penetrating the wafer so that parts of the first conductive vias contacting with the wafer are exposed; (G) filling a second insulating layer in the through holes; and (H) forming a plurality of second conductive vias in the second insulating layer within the through holes, and the second conductive vias are electrically connected with the first conductive vias.

To attain the aforesaid objects, a wafer-leveled chip packaging method according to the present invention comprises the steps of: a wafer having a first surface, on which an integrated circuit pattern and a plurality of pads are formed, and a plurality of through holes penetrating the wafer, wherein a second insulating layer is filled in the through holes and at least one second conducting via passes through the second insulating layer; a plurality of first chips each having at least one pad on the first surface of the wafer, wherein the pads being mounted on the surface of the first chip which is opposed to the wafer; a first insulating layer formed on the first surface of the wafer, having a plurality of first conductive vias penetrating the first insulating layer, wherein the first insulating layer covers the first chips and the integrated circuit pattern of the wafer; and a conductive pattern layer formed on a surface opposed to the wafer of the first insulating layer, and the conductive pattern layer is electrically connected with the first conductive vias; wherein parts of the first conductive vias are connected with the pads of the wafer, parts of the first conductive vias are connected with the pads of the first chips and part of the first conductive vias are connected with the second conductive vias in the through holes.

In the wafer-leveled chip packaging method according to the present invention, the wafer is either a wafer with an integrated circuit thereon or a wafer without an integrated circuit. In the wafer-leveled chip packaging structure and method thereof according to the present invention, the quantity of chip layers in stack on the wafer is not specifically defined, which can be a form of either having a plurality of first chips attached directly to the first surface of the wafer or having other chips stacked on the first chip by the way of "build-up". In the wafer-leveled chip packaging method according to the present invention, the method to attach the first chip is case-sensitive. In the case of the wafer with an integrated circuit pattern, it is preferable to attach the first chip to the first surface of the wafer with a non-conductive adhesive, wherein the pads of the first chip is disposed on the surface which is opposed to the wafer. The first chips can also be attached to the first surface of the wafer with a thermal adhesive so as to enhance the ability of heat dissipation. In the case of the wafer with an integrated circuit pattern, it is preferable to form an insulating layer and a second conductive pattern layer on the first surface of the wafer first, then attaching the first chip to the first surface of the wafer with an anisotropic conductive glue or a non-conductive glue, wherein the pads of the first chip are disposed on the surface facing the first surface of the wafer and electrically connected with the second conductive pattern layer. In addition, the pads of the first chip can alternatively be disposed on a surface opposed to the wafer when the first chip attaches to the first surface of the wafer. In the wafer-leveled chip packaging method according to the present invention, the formation method of the first insulating layer is not limited, and is preferably by laminating or coating. The first conductive vias and the second conductive vias are preferably formed by generating the via-holes by laser or photolithography first, and then filling the via-holes with conducting material by electroplating, electroless plating or the combination thereof. Alternatively, the first conductive vias and the second conductive vias can be formed by generating the via-holes by laser drilling first, and then metalizing the inner surfaces of the via-holes by sputtering or evaporation. The through holes are preferably formed by wet etching or dry etching. In the wafer-leveled chip packaging structure according to the present invention, the second insulating layer is preferably thicker than the wafer to protect the wafer. Even so, the thickness of the second conducting layer can be equal or less than that of the wafer to meet the requirement for a thinner package.

In the wafer-leveled chip packaging structure and method thereof according to the present invention, it is preferable to further comprise a third insulating layer having a pattern formed on the conductive pattern layer to protect the conductive pattern layer after the formation of the conductive pattern layer on the surface of the first insulating layer. The third insulating layer can preferably be a solder mask layer or a protection layer. When the third insulating layer is a solder mask layer, a plurality of solder balls, needle pins or other like structures can be formed on the third insulating layer and be electrically connected with the conductive pattern layer. Alternatively, the solder balls, needle pins or the like of the present invention can also be formed on the second conductive vias. When the third insulating layer is a protection layer, a plurality of second chips can be carried on the surface of the third insulating layer, a fourth insulating layer then covers the second chips, and a plurality of fourth conductive vias penetrating the fourth insulating layer are formed.

In the wafer-leveled chip packaging structure and method thereof according to the present invention, the wafer can be preferably diced to form a plurality of chip scale package structures. Because the two sides of the resulting package structure both have conductive patterns that can be connected with the electric circuits of the wafer or of the other chips, the resulting package structures of the present invention can be stacked.

Additional features and advantages of the present invention will be set forth in part in the description which follows, and in part will be obvious from the description, or may be learned by practice of the present invention. The features and advantages of the present invention will be realized and attained by means of the elements and combinations particularly pointed out in the henceforth appended claims.

It is to be understood that both the foregoing general description and the following detailed description are exemplary and explanatory only and are not restrictive of the present invention, as claimed.

The accompanying drawings, which are incorporated in and constitute a part of this specification, illustrate several embodiments of the present invention and together with the description, serve to explain the principles of the present invention.

DETAILED DESCRIPTION

Reference will now be made in detail to present embodiments of the present invention, examples of which are illustrated in the accompanying drawings. Where ever possible, the same reference numbers will be used throughout the drawings to refer to the same or like parts.

To illustrate the present invention, three preferred embodiments are described now.

Embodiment 1

Figure 1A:
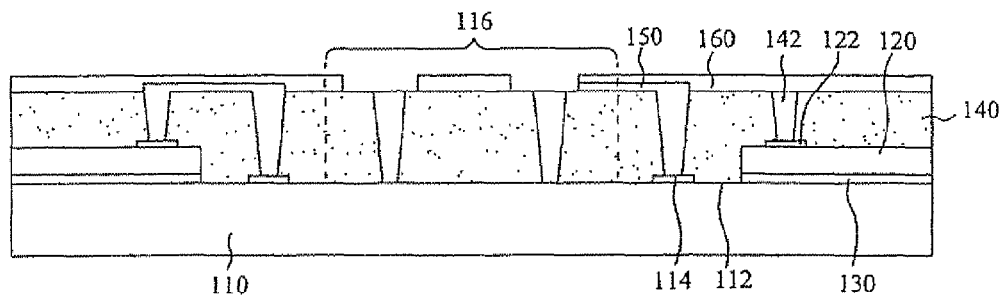
FIGS. 1A through 1G are flowcharts illustrating the wafer-leveled chip packaging method according to a preferred embodiment of the present invention.

A wafer-leveled chip packaging method of this embodiment comprises the following steps. First, referring to FIG. 1A, a silicon wafer 110 having an integrated circuit is provided. The silicon wafer 110 has a first surface 112 on which a plurality of pads 114 is mounted. Then, a plurality of first chips 120 each having at least one pad 122 is attached to the first surface 112 of the silicon wafer 110 with an adhesive 130, wherein the pad 122 is disposed on a surface opposed to the silicon wafer 110. Then, a first insulating layer 140 is laminated on the first surface 112 of the silicon wafer 110. Next, a plurality of via-holes is formed by laser or photolithography, and after that a conducting material is filled in the via-holes by electroplating, electroless plating or the combination thereof so as to form a plurality of first conductive vias 142 penetrating the first insulating layer 140. Parts of first conductive vias 142 are connected with the pads 114 of the silicon wafer 110 at the bottom thereof. Parts of the bottom of first conductive vias 142 are connected with the pads 122 of the first chips 120 at the bottom thereof. Parts of first conductive vias 142 are connected with a scribe-line region 116 of the silicon wafer 110 at the bottoms thereof. Then, a conductive pattern layer 150 is formed on the surface of the first insulating layer 140 and is electrically connected with the first conductive vias 142. Then, a solder mask layer 160 having a pattern is formed on the conductive pattern layer 150 to protect the conductive pattern layer 150.

Figure 1B:
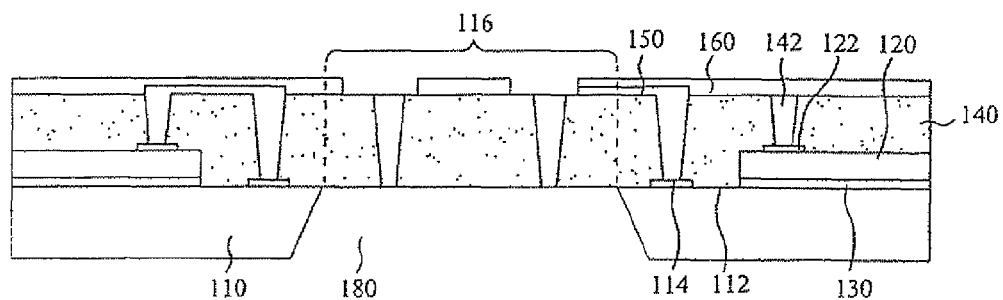

Referring now to FIG. 1B, the wafer 110 is wet etched with an HF solution or a mixed solution such as "Isoform Silicon etch solution" manufactured by Micro Image technology Ltd. In order to form a plurality of through holes 180 penetrating the scribe-line area 116 of the silicon wafer 110. As a result, the ends of the first conductive vias 142 that are in contact with the silicon wafer 110 in the scribe-line area 116 are exposed.

Figure 1C:
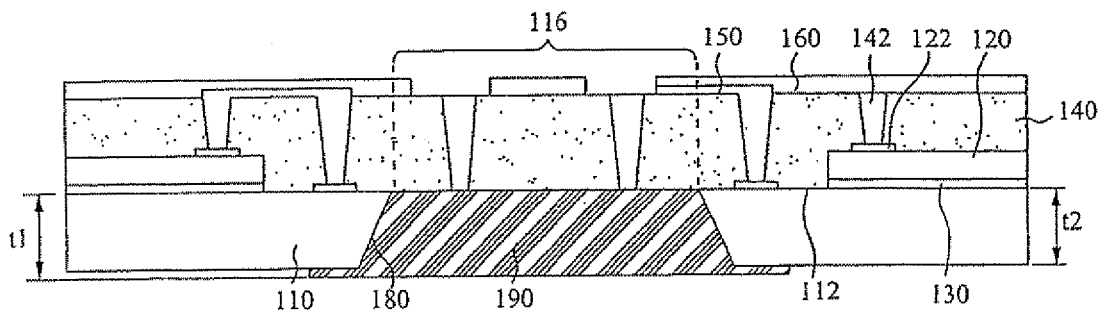

Referring to FIG. 1C, a second insulating layer 190 made of epoxy is filled in the through holes 180, having a thickness t1 greater than the thickness t2 of the silicon wafer 110 to protect the parts of the silicon wafer 110 adjacent to the edges of the through holes 180.

Figure 1D:
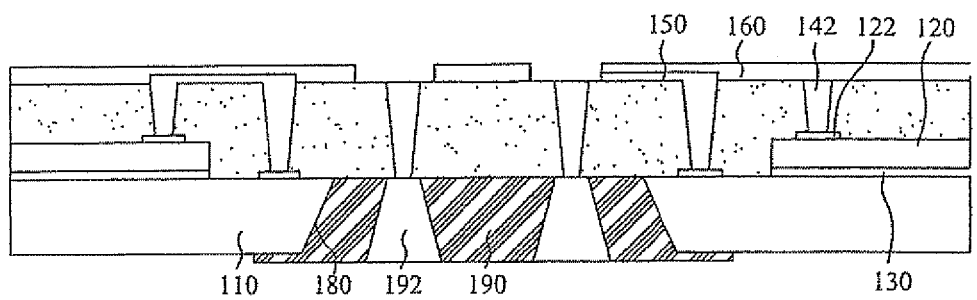
Figure 1E:
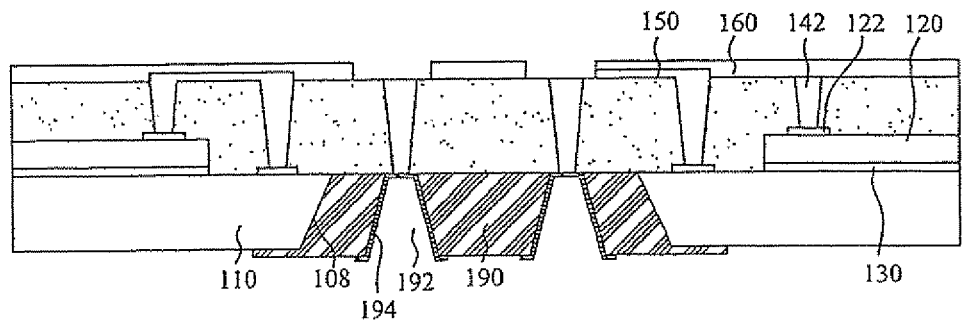

Referring to FIG. 1D and FIG. 1E, a plurality of via-holes is formed in the second conducting layer 190 by laser drilling. Then the inner surfaces of these via-holes are metallized to form a plurality of second conductive vias 192, and each of them has a metallic film 194. These second conductive vias 192 pass through the through holes 180 and are electrically connected with the first conductive vias 142.

Figure 1F:
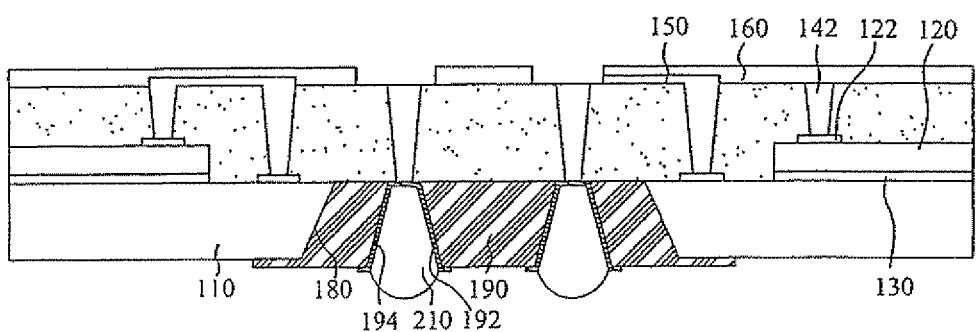
Figure 1G:
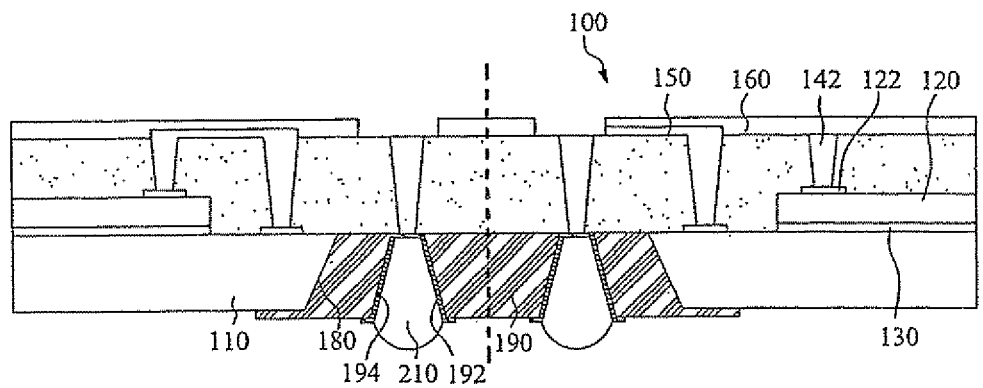

Referring to FIG. 1F, a plurality of solder balls 210 is soldered to the second conductive vias 192. Finally, referring to FIG. 1G, the silicon wafer 110 is diced to form a plurality of stackable chip scale package structures 100.

Figure 2:
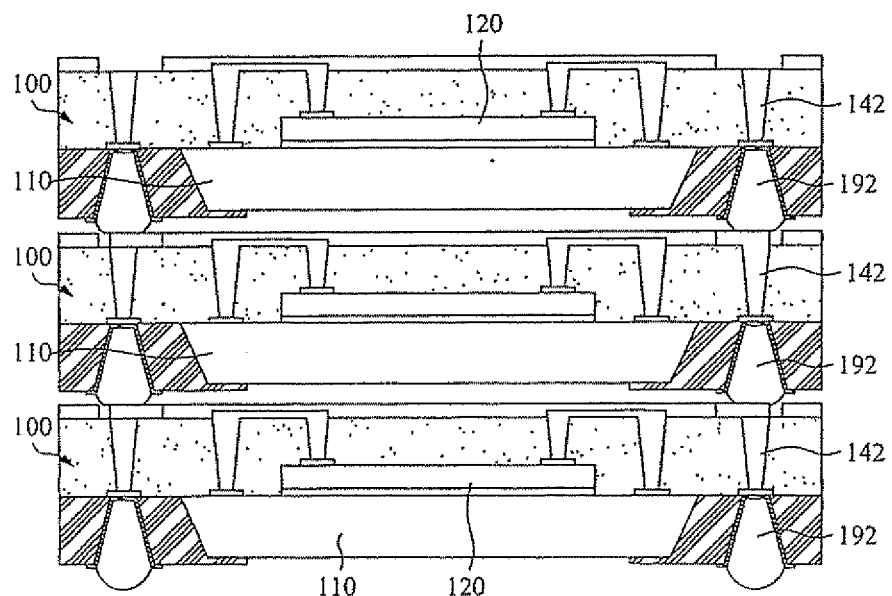
FIG. 2 is a schematic view of a stack of wafer-leveled chip package structures according to a preferred embodiment formed by the wafer-leveled chip packaging method as shown in FIGS. 1A through 1G.

Three chip scale package structures 100 of this embodiment are stacked as shown in FIG. 2. The transmissions of the electric signal among these chip scale package structures are achieved primarily by means of the first conductive vias 142 and the second conductive vias 192. The method is processed thoroughly at the wafer level and is suitable for mass production. Besides, because there is no new processing technology involved, the wafer-leveled chip packaging structure and method thereof of the present invention are easy to accomplish. In addition, because the chip (with a size between 50 μm to 100 μm) is carried on a much thicker silicon wafer (with a size about 700 μm) and both of them are made of silicon, there is no difference in thermal deformation which is caused at the interface between the two different materials with different thermal expansion coefficients respectively, as in the conventional semiconductor electronic packages. Thus, the thermal stress generated between the chip and the silicon wafer can be reduced, and also, the reliability of the package can be remarkably improved.

Embodiment 2

Figure 3:
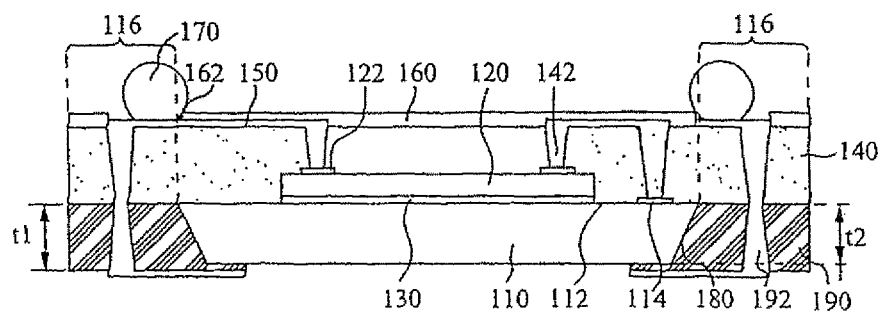
FIG. 3 is a schematic view of a preferred embodiment using the wafer-leveled chip packaging method according to the present invention.

Referring now to FIG. 3, the second embodiment of a wafer-leveled chip packaging method of the present invention is disclosed, which comprises the following steps. A silicon wafer 110 having an integrated circuit pattern is provided. The silicon wafer 110 has a first surface 112 on which a plurality of pads 114 is mounted. Then, a plurality of first chips 120 each having at least one pad 122 is attached to the first surface 112 of the silicon wafer 110 with a non-conductive adhesive 130, wherein the pad 122 is disposed on a surface opposed to the silicon wafer 110, whereafter a first insulating layer 140 is coated on the first surface 112 of the silicon wafer 110. Then, a plurality of via-holes is formed by laser drilling.

Next, a conducting material is filled in the via-holes by electroplating or electroless plating so as to form a plurality of first conductive vias 142 penetrating the first insulating layer 140. Parts of first conductive vias 142 are connected with the pads 114 of the silicon wafer 110 at the bottom thereof Parts of the bottom of the first conductive vias 142 are connected with the pads 122 of the first chips 120 at the bottom thereof Parts of first conductive vias 142 are connected with a scribe-line region 116 of the silicon wafer 110 at the bottoms thereof. Then, a conductive pattern layer 150 is formed on the surface of the first insulating layer 140 and is electrically connected with the first conductive vias 142. Subsequently, a solder mask layer 160 having a pattern is formed on the conductive pattern layer 150 to protect the conductive pattern layer 150. Then, a plurality of solder balls 170 is formed in via-holes 162 of the solder mask layer 160 so that these solder balls 170 are electrically connected with the conductive pattern layer 150. The wafer 110 is dry etched to form a plurality of through holes 180 penetrating the scribe-line area 116 of the silicon wafer 110. As a result, the ends of the first conductive vias 142 in contact with the silicon wafer 110 in the scribe-line area 116 are exposed. A second insulating layer 190 is then filled in the through holes 180, having a thickness t1 greater than the thickness t2 of the silicon wafer 110 to protect the parts of the silicon wafer 110 adjacent to the edges of the through holes 180. A plurality of via-holes is formed by laser drilling, and then, a conducting material is filled in these via-holes by electroplating to form a plurality of second conductive vias 192 penetrating the through holes 180 and being electrically connected with the first conductive vias 142. Finally, the silicon wafer 110 is diced to form a stackable chip scale package structure as shown in FIG. 3.

Because the two sides of the chip scale package structure both have conductive patterns that can be connected with the electric circuits of the wafer or of the other chips, the chip scale package structures of the present invention can be stacked as shown in FIG. 2. In this embodiment, because the solder balls 170 are disposed on the inner sides of the first conductive vias 142, rather than on the orthogonal surface of the first conductive vias 142 or the second conductive vias 192, the size of the scribe-line area 116 does not have any matter on the solder balls 170. Furthermore, because the silicon wafer substrate faces outward (as opposed to the solder balls), the chip scale package structure of this embodiment is convenient to be connected with an external heat dissipation device, such as a heat sink, providing further heat dissipation efficiency.

Embodiment 3

Figure 4:
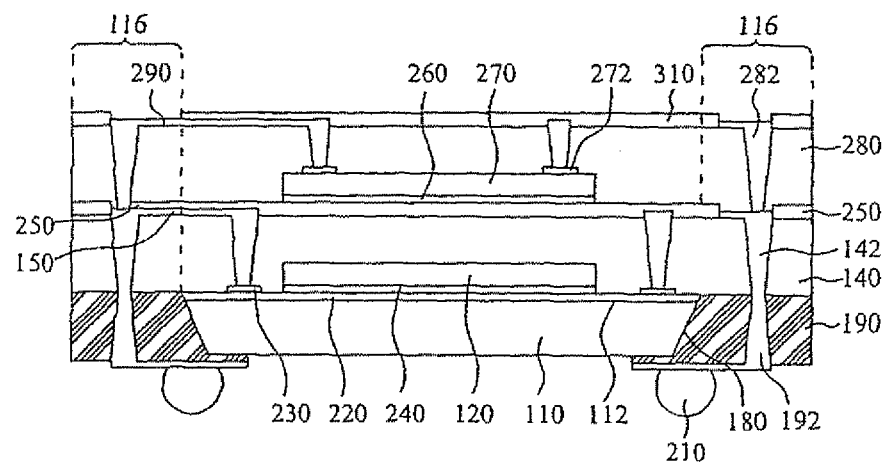
FIG. 4 is a schematic view of another preferred embodiment using the wafer-leveled chip packaging method according to the present invention.

Referring to FIG. 4, this embodiment discloses a wafer-leveled chip packaging method comprising following steps. A silicon wafer 110 having a first surface 112 is provided. An insulating layer 220 and a second conductive pattern layer 230 are formed sequentially on the first surface 112 of the silicon wafer 110. Then, an anisotropic conductive glue 240 is used to bond a first chip 120 to the silicon wafer 110 with the surface having a circuit pattern formed thereon for additional heat transferring, wherein the second conductive pattern layer 230 formed on the silicon wafer 110 is electrically connected with the first chip 120. A first insulating layer 140 is laminated on the silicon wafer 110. Then, a plurality of via-holes is formed by photolithography and a conducting material is filled in the via-holes by electroless plating to form a plurality of first conductive vias 142 which pass through the first insulating layer 140. Parts of the first conductive vias 142 are connected with the second conductive pattern layer 230 at the bottom thereof. Parts of the first conductive vias 142 are connected with a scribe-line region 116 of the silicon wafer 110 at the bottoms thereof. A conductive pattern layer 150 is formed on the surface of the first insulating layer 140 and is electrically connected with the first conductive vias 142. A protection layer 250 having a pattern is formed on the conductive pattern layer 150 to protect the conductive pattern layer 150. A non-conductive adhesive 260 is used to bond a plurality of second chips 270 each having at least one pad 272 to the protection layer 250. These pads 272 are disposed on the surface opposed the protection layer 250. A fourth insulating layer 280 is pressed on the second chips 270. A plurality of via-holes is formed by laser drilling and a conducting material is filled in the via-holes by electroplating to form a plurality of fourth conductive vias 282 which pass through the fourth insulating layer 280. Parts of fourth conductive vias 282 are connected with the pads 272 of the second chips 270 at the bottom thereof. Parts of fourth conductive vias 282 are connected with a conductive pattern layer 150 at the bottoms thereof. A third conducting layer 290 is formed on the fourth conducting layer 280 and is electrically connected with the fourth conductive vias 282. A protection layer 310 having a pattern is formed on the third conductive pattern layer 290. The back face of the silicon wafer 110 is wet etched with an HF solution to form a plurality of through holes 180 penetrating the silicon wafer 110. The through holes 180 are disposed outside the region where the first chip 120 is carried so that the ends of those first conductive vias 142 being in contact with the silicon wafer 110 with in that region are exposed. A second insulating layer 190 of epoxy is filled in the through holes 180. A plurality of via-holes is then formed in the second insulating layer 190 by laser drilling and a conducting material is filled in the via-holes by electroplating to form a plurality of second conductive vias 192. These second conductive vias 192 pass through the through holes 180 and are electrically connected with the first conductive vias 142. A plurality of solder balls 210 is soldered to the inner sides of the second conductive vias 192. Finally, the silicon wafer 110 is diced to form a stackable chip scale package structure as shown in FIG. 4.

Because the two sides of the chip scale package structure both have conductive patterns that can be connected with the electric circuits of the wafer or of the other chips, the chip scale package structures of the present invention can be stacked. Furthermore, because two or more layers of chip can be stacked in a unit package area, the chip density of the package can effectively increase. In addition, the method is processed thoroughly at the wafer level and is suitable for mass production. Besides, due to no new processing technology being involved, the wafer-leveled chip packaging structure and method thereof of the present invention are easy to accomplish. In addition, because the chip is carried on silicon wafer, the thermal stress generated between the chip and the silicon wafer can be reduced, and also, the reliability of the package can be remarkably improved.

Other embodiments of the present invention will be apparent to those skilled in the art from consideration of the specification and practice of the present invention disclosed herein. It is intended that the specification and examples be considered as exemplary only, with a true scope and spirit of the present invention being indicated by the following claims.

The invention claimed is:
1. A wafer-leveled chip package structure, comprising:
a wafer having a first surface, on which an integrated circuit pattern and a plurality of pads are formed, and a plurality of through holes penetrating said wafer;
a plurality of first chips each having at least one pad on said first surface of said wafer, wherein said pads being mounted on the surface of said first chips which are opposed to said wafer;
a first insulating layer formed on said first surface of said wafer, having a plurality of first conductive vias penetrating said first insulating layer, wherein said first insulating layer covers said first chips and said integrated circuit pattern of said wafer;

a conductive pattern layer formed on a surface opposed to said wafer of said first insulating layer, and said conductive pattern layer is electrically connected with said first conductive vias;

wherein a second insulating layer is filled in said through holes and at least one second conducting via passes through said second insulating layer, parts of said first conductive vias are connected with said pads of said wafer, parts of said first conductive vias are connected with said pads of said first chips and part of said first conductive vias are connected with said second conductive vias in said through holes;

a third insulating layer having a pattern formed on a surface of said first conductive pattern layer which is opposed to said first insulating layer, wherein said third insulating layer protects said first conductive pattern layer; and a plurality of second chips each having at least one pad on said third insulating layer, wherein said pad is disposed on the surface of said second chips which is opposed to said third insulating layer.

2. The wafer-leveled chip package structure of claim 1, further comprising a plurality of solder balls or needle pins soldered to the inner sides of said second conductive via.

3. The wafer-leveled chip package structure of claim 1, further comprising a fourth insulating layer covering said second chips and said third insulating layer.

4. The wafer-leveled chip package structure of claim 3, further comprising a plurality of fourth conductive vias passing through said fourth insulating layer.

5. The wafer-leveled chip package structure of claim 3, further comprising a third conducting layer formed on said fourth conducting layer and electrically connected with said fourth conductive vias.

6. The wafer-leveled chip package structure of claim 5, further comprising a protection layer having a pattern and formed on said third conductive pattern layer.

7. The wafer-leveled chip package structure of claim 1, further comprising an insulating layer formed on said first surface of said wafer.

8. The wafer-leveled chip package structure of claim 7, further comprising a second conductive pattern layer formed on said insulating layer, wherein said second conductive pattern layer is electrically connected with said first chip.

9. The wafer-leveled chip package structure of claim 1, wherein said first chips are bonded to said wafer with an anisotropic conductive glue.

10. A package set, comprising:
a first wafer-leveled chip package structure; and
a second wafer-leveled chip package structure stacked on said first wafer-leveled chip package structure;
wherein both said first wafer-leveled chip package structure and said second wafer-leveled chip package structure comprising:
a wafer having a first surface, on which an integrated circuit pattern and a plurality of pads are formed, and a plurality of through holes penetrating said wafer;
a plurality of first chips each having at least one pad on said first surface of said wafer, wherein said pads being mounted on the surface of said first chips which are opposed to said wafer;
a first insulating layer formed on said first surface of said wafer, having a plurality of first conductive vias penetrating said first insulating layer, wherein said first insulating layer covers said first chips and said integrated circuit pattern of said wafer;
a conductive pattern layer formed on a surface opposed to said wafer of said first insulating layer, and said conductive pattern layer is electrically connected with said first conductive vias;
wherein a second insulating layer is filled in said through holes and at least one second conducting via passes through said second insulating layer, and a plurality of solder balls or needle pins formed in said third insulating layer, wherein said solder balls or needle pins are electrically connected with said first conductive pattern layer, parts of said first conductive vias are connected with said pads of said wafer parts of said first conductive vias are connected with said pads of said first chips and part of said first conductive vias are connected with said second conductive vias said through holes; and
a third insulating layer having a pattern formed on a surface of said first conductive pattern layer which is opposed to said first insulating layer, wherein said third insulating layer protects said first conductive pattern layer; wherein said second conducting via of said second wafer-leveled chip package structure is electrically connected with said solder balls or needle pins of said first wafer-leveled chip package structure.

11. The package set of claim 10 wherein said first conductive vias 142 are formed by a laser drilling process.

12. The package set of claim 10, wherein said solder balls are formed in a plurality of via-holes of said third insulating layer.

13. The package set of claim 10, wherein said first chip of said first wafer-leveled chip package structure is attached to said first surface of said wafer with an adhesive.

14. The package set of claim 10, wherein said third insulating layer of said first wafer-leveled chip package structure is a solder mask layer.

* * * * *